United States Patent
Takeuchi et al.

(10) Patent No.: US 8,496,016 B2
(45) Date of Patent: Jul. 30, 2013

(54) CLEANING APPARATUS AND CLEANING METHOD

(75) Inventors: Mitsuo Takeuchi, Kawasaki (JP); Michinao Nomura, Kawasaki (JP); Toshinori Kasuga, Kawasaki (JP); Hiroaki Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 256 days.

(21) Appl. No.: 12/860,567

(22) Filed: Aug. 20, 2010

(65) Prior Publication Data

US 2011/0041879 A1 Feb. 24, 2011

(30) Foreign Application Priority Data

Aug. 20, 2009 (JP) .................................. 2009-191287

(51) Int. Cl.
*B08B 3/12* (2006.01)
(52) U.S. Cl.
USPC ............................................................ 134/184
(58) Field of Classification Search
USPC ............................................... 134/1, 1.3, 184
See application file for complete search history.

(56) References Cited

U.S. PATENT DOCUMENTS

| 6,260,562 B1 * | 7/2001 | Morinishi et al. ........ 134/57 R |
| 2007/0090126 A1 | 4/2007 | Tanaka et al. |

FOREIGN PATENT DOCUMENTS

| JP | 62-122132 | 6/1987 |
| JP | 10-92781 | 4/1998 |
| JP | 10-163153 | 6/1998 |
| JP | 2003-93984 A | 4/2003 |
| JP | 2006-231185 A | 9/2006 |
| JP | 2007-029912 | 2/2007 |

OTHER PUBLICATIONS

Japanese Office Action mailed May 28, 2013 for corresponding Japanese Application No. 2009-191287, with English-language translation.

* cited by examiner

*Primary Examiner* — Michael Barr
*Assistant Examiner* — David Cormier
(74) *Attorney, Agent, or Firm* — Fujitsu Patent Center

(57) ABSTRACT

A cleaning apparatus includes: a supply unit to supply at least an initial amount of cleaning solution to a specific portion of an object to be cleaned; an agitator to induce agitation in the cleaning solution supplied to the object; a monitoring unit to monitor an amount of the cleaning solution and to provide a signal indicative thereof; and a control unit to detect a threshold amount of reduction in the cleaning solution based on the signal from the monitoring unit and accordingly to control the supply unit to supply an additional amount of cleaning solution to the specific portion of the object.

6 Claims, 7 Drawing Sheets

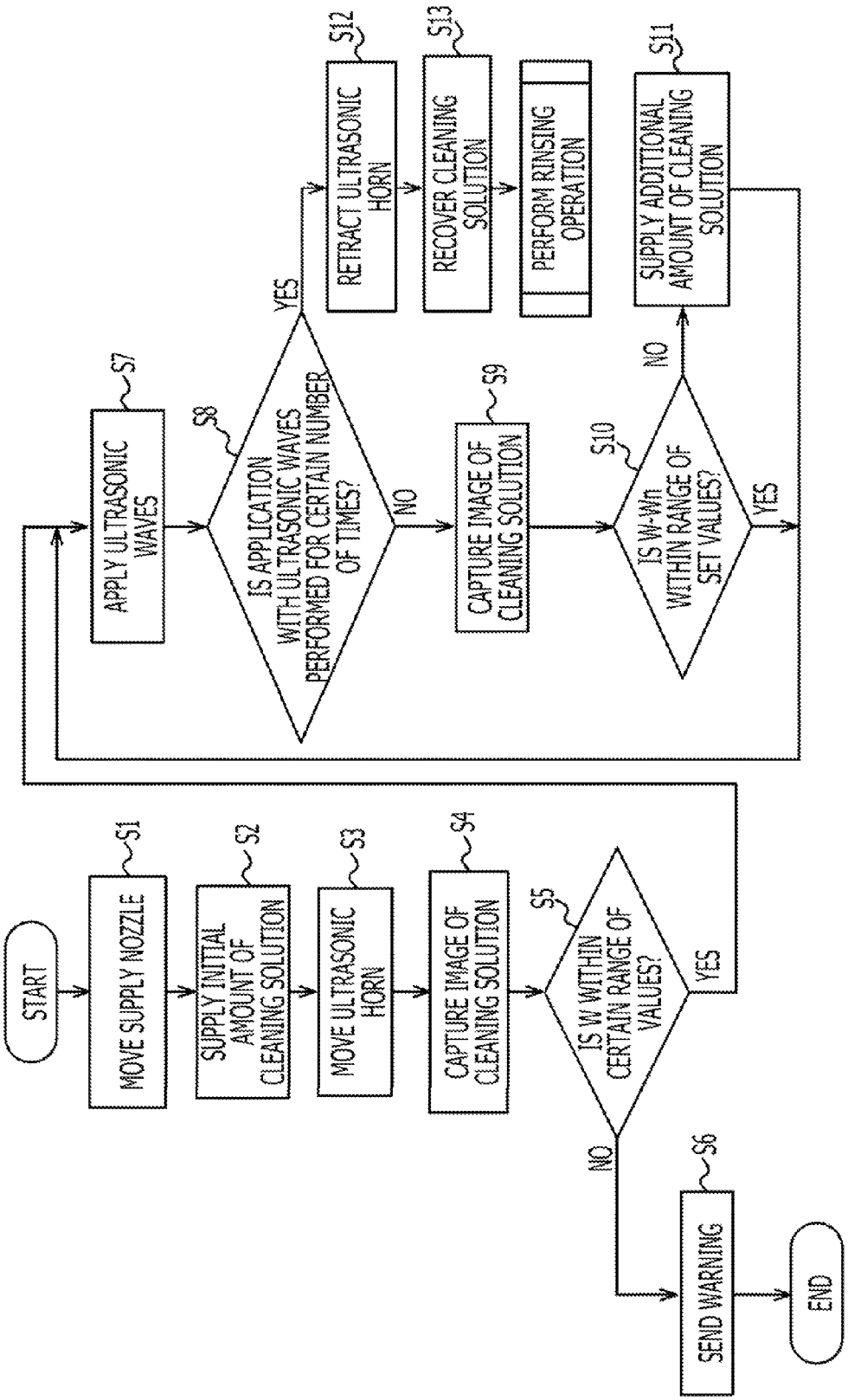

_US 8,496,016 B2_

CLEANING APPARATUS AND CLEANING METHOD

CROSS-REFERENCE TO RELATED APPLICATIONS

This application is based upon and claims the benefit of priority of the prior Japanese Patent Application No. 2009-191287, filed on Aug. 20, 2009, the entire contents of which are incorporated herein by reference.

FIELD

Embodiments discussed herein relate to a cleaning apparatus and a cleaning method.

BACKGROUND

Japanese Patent Application Laid-open Publication No. 2006-231185 and Japanese Patent Application Laid-open Publication No. 2003-93984 discuss techniques for partially cleaning an object by supplying a cleaning solution to a specific portion of the object to be cleaned. High frequency sound waves are generated within the cleaning solution, which induces cavitation within the cleaning solution, i.e., which agitates the cleaning solution. Such agitation facilitates fine albeit undesired particles becoming unstick from the object such that the fine particles float in the cleaning solution. After that, the cleaning solution is recovered. The cleaning solution is supplied generally to the specific portion of the object, so that the object may be cleaned with a small amount of the cleaning solution.

When the cleaning solution activates, the cleaning solution is highly heated, some of the cleaning solution is atomized, and some of the atomized cleaning solution is evaporated, so that it is probable that the amount of the cleaning solution is reduced. When the amount of the cleaning solution is reduced, a portion where the cleaning solution dries may be caused on a surface of the object. As a result, it is probable that the fine particles are left on the portion that the cleaning solution dries. In particular, even when a minute amount of the cleaning solution is evaporated, the portion where the cleaning solution dries may be caused on the surface of the object because the amount of the cleaning solution supplied to the object is small.

SUMMARY

According to an embodiment of the invention, a cleaning apparatus includes: a supply unit to supply at least an initial amount of cleaning solution to a specific portion of an object to be cleaned; an agitator to induce agitation in the cleaning solution supplied to the object; a monitoring unit to monitor an amount of the cleaning solution and to provide a signal indicative thereof; and a control unit to detect a threshold amount of reduction in the cleaning solution based on the signal from the monitoring unit and accordingly to control the supply unit to supply an additional amount of cleaning solution to the specific portion of the object.

Advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a flowchart of cleaning operations performed by a control unit according to an embodiment of the invention.

DESCRIPTION OF EMBODIMENT

Figure 1:
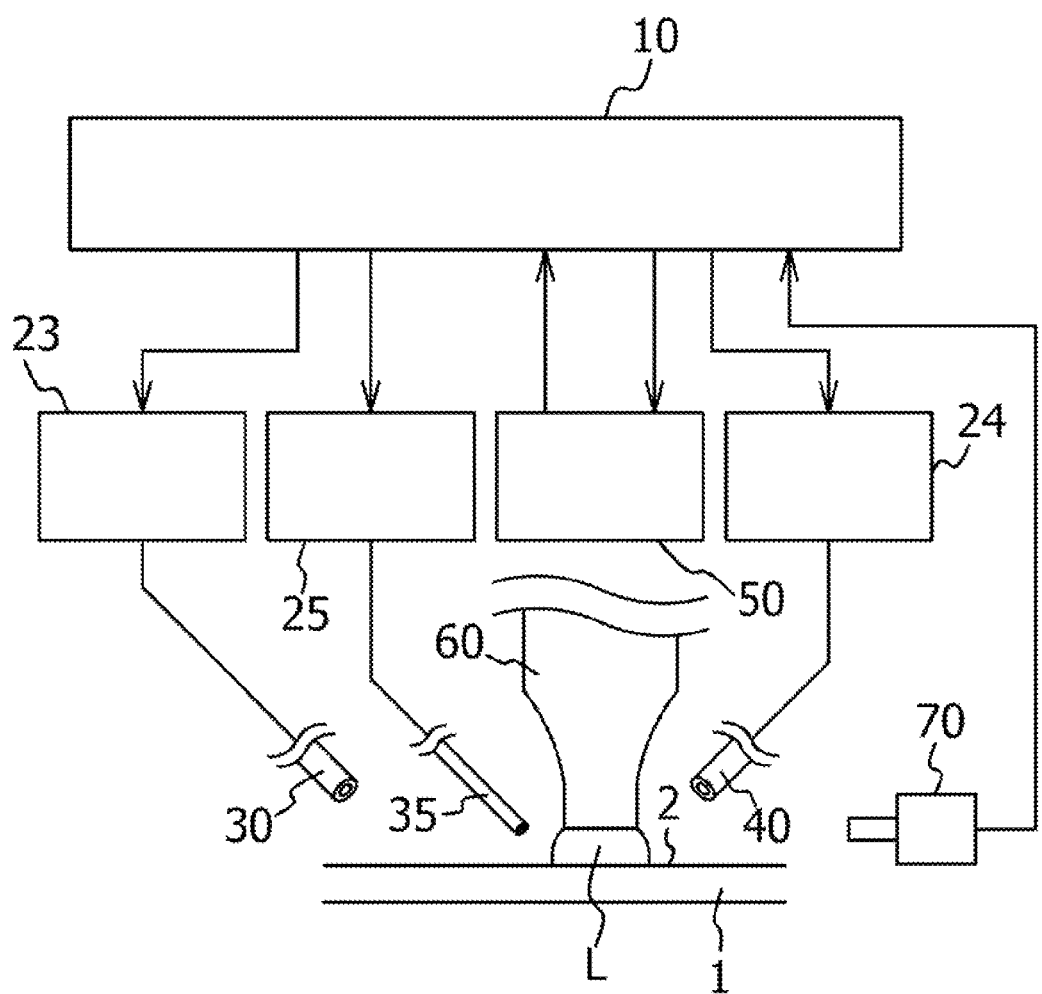
FIG. 1 is an explanatory drawing of a cleaning apparatus according to an embodiment of the invention.

FIG. 1 is an explanatory drawing of a cleaning apparatus according to an embodiment of the invention. The cleaning apparatus includes a control unit 10, a supply nozzle 30, an adding nozzle 35, a recovery nozzle 40, an ultrasonic oscillator 50, an ultrasonic horn 60, and a camera 70. Together, the ultrasonic oscillator and the horn 60 may be regarded as a type of agitator. The control unit 10 controls the entire cleaning apparatus by sending commands to each device. The control unit 10 includes a central processing unit (CPU), a read only memory (ROM), and a random access memory (RAM) that are not illustrated. The control unit 10 may be a computer, for example.

The supply nozzle 30 supplies a cleaning solution L to a object 1 that is an object to be cleaned. The control unit 10 drives a pump 23 coupled to the supply nozzle 30 and causes the supply nozzle 30 to supply the cleaning solution L.

The adding nozzle 35 adds a new cleaning solution L to the supplied cleaning solution L. The control unit 10 drives a pump 25 coupled to the adding nozzle 35 and causes the adding nozzle 35 to supply the cleaning solution L. The diameter of a bore of the adding nozzle 35 is formed smaller than a bore of the supply nozzle 30. The diameter of the bore of the adding nozzle 35 may be about 100 μmm, for example. The supply nozzle 30 and the adding nozzle 35 are coupled to a tank (not illustrated) that stores the cleaning solution L.

The recovery nozzle 40 draws and recovers the cleaning solution L on the object 1. The recovery nozzle 40 is coupled to a reduced pressure pump 24 for drawing the cleaning solution L. The recovery nozzle 40 is coupled to a drain tank (not illustrated) to store the recovered cleaning solution L.

The ultrasonic oscillator 50 includes a piezoelectric element that is deformed by having applied thereto a voltage. The ultrasonic oscillator 50 changes the pressure in a pressure chamber (not illustrated) utilizing the deformation of the piezoelectric element. The pressure chamber is communicated with the horn 60. The horn 60 improves the coupling efficiency between the ultrasonic oscillator 50 and the cleaning solution L supplied to a surface 2 of the object 1. The horn 60 couples ultrasonic waves to the cleaning solution L. The horn 60 may be a known device.

The camera 70 monitors the amount of the cleaning solution L by capturing an image of the cleaning solution L supplied to the object (that is to be cleaned) 1. The camera 70 monitors the amount of the cleaning solution L by monitoring a shape of the cleaning solution L, and provides a signal indicative thereof. The control unit 10 detects reduction in the cleaning solution L based the signal from the camera 70. For example, the control unit 10 detects the reduction in the cleaning solution L in the cleaning operations based on the image captured by the camera 70. The ROM of the control unit 10 stores a program to process the captured image.

Figure 2:
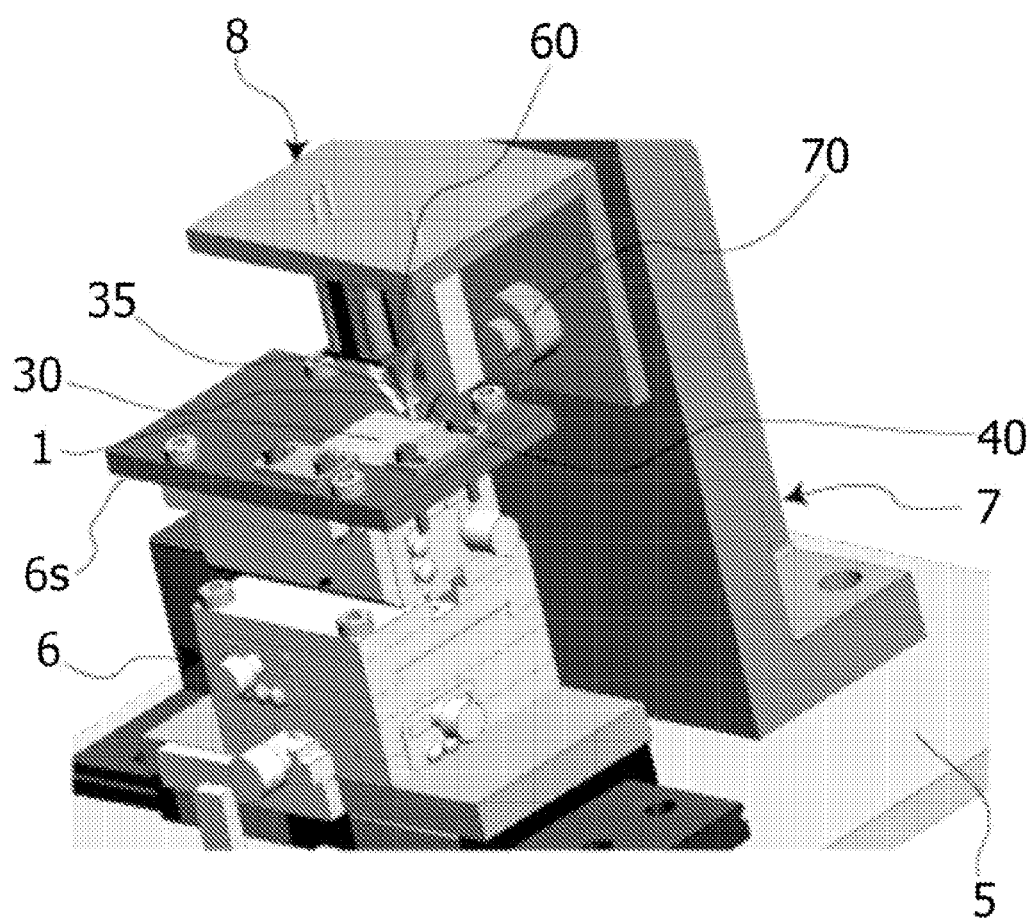
FIG. 2 is an external drawing of the cleaning apparatus according to the embodiment.

FIG. 2 illustrates an external drawing of the cleaning apparatus. A support base 5 supports a driving mechanism 6 and a support wall 7. A stage 6s is secured to an upper part of the driving mechanism 6. The driving mechanism 6 may move the stage 6s in a direction X, Y, or Z (not illustrated). The driving mechanism 6 stops the stage 6s at the desired position in response to the command from the control unit 10. The object 1 is placed on the stage 6s.

The support wall 7 extends substantially vertically. A holding member 8 that is approximately L-shaped when viewed from a side is secured to the support wall 7. The holding member 8 holds the supply nozzle 30, the adding nozzle 35, the recovery nozzle 40, the horn 60, and a camera 70. The stage 6s moves with respect to the horn 60 and the like so that the object 1 is located at a desirable position for the cleaning operations.

The supply nozzle 30, the adding nozzle 35, the recovery nozzle 40, and the horn 60 are coupled to a lift (not illustrated), and may move substantially vertically. The supply nozzle 30, the adding nozzle 35, the recovery nozzle 40, and the horn 60 move toward and away from the object 1 in response to the command from the control unit 10. The camera 70 is secured to the holding member 8 at a desirable position for capturing the image of the surface 2 of the object 1 in the cleaning operations.

The cleaning solution may be water, for example. Alternatively, the cleaning solution may be detergent, organic solvent, or the like. The object 1 may be a lens, for example. Alternatively, the object 1 may be a semiconductor wafer, a printed board, a glass, a film, or the like. The cleaning apparatus according to the embodiment supplies the cleaning solution L on a specific portion of the surface 2 of the object 1, and cleans the object 1 partially, so that the object 1 may be cleaned with a small amount of the cleaning solution L. In addition, the cleaning apparatus according to the embodiment is suitable when an object that may be generally partially cleaned is desired to be fully cleaned.

The cleaning apparatus according to the embodiment agitates the cleaning solution L by applying the ultrasonic waves to the cleaning solution L in the cleaning operations, so that fine particles that stick to the object 1 may float in the cleaning solution L. Therefore, the object 1 may be cleaned even when the concentration of a cleansing component in the cleaning solution is low, or even when the detergency of the cleaning solution is poor.

Figure 3A:
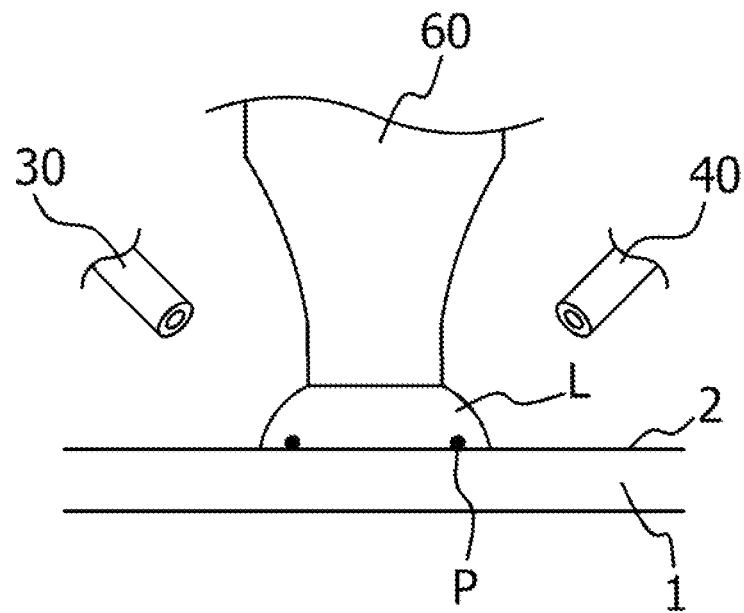
FIGS. 3A and 3B are explanatory drawings of a cleaning method different from a cleaning method according to the embodiment.
Figure 3B:
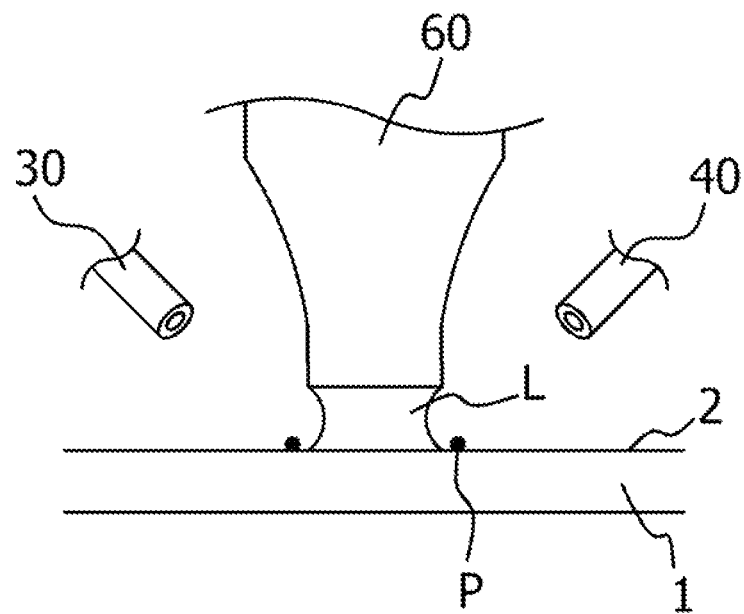

Next, potential problems that may occur in a cleaning method different from a cleaning method according to the embodiment will be described before the cleaning method according to the embodiment is described. FIGS. 3A and 3B are explanatory drawings of the cleaning method different from the cleaning method according to the embodiment. The stage 6s placed with the object 1 is omitted in FIGS. 3A and 3B.

As illustrated in FIG. 3A, the horn 60 is coupled to the cleaning solution L supplied to the surface 2 and applies the ultrasonic waves to the cleaning solution L so that the fine particles P that stick to the surface 2, such as dust, float in the cleaning solution L. When the cleaning solution L is subjected to the ultrasonic waves for a specific time period, the temperature of the cleaning solution L will increase and some of the cleaning solution L will be atomized or evaporated. As a result, the amount of the cleaning solution L is reduced as illustrated in FIG. 3B and a portion where the cleaning solution L dries is caused on the surface 2. Thus, it is probable that the fine particles P may be left on the portion. And, the left fine particles P may stick to the surface 2. In this case, it may be difficult to remove the fine particles P sticking to the surface 2 in a cleaning solution L recovery operation and a rinsing operation that are performed afterward.

The reduction in the amount of the cleaning solution L will cause a corresponding reduction in the volume of the target that is to be subjected to the ultrasonic waves. Therefore, the reduction in the amount of the cleaning solution L may affect an output or impedance of the ultrasonic waves. When the cleaning efficiency is changed, the cleaning performance that is desirably enhanced depending on the length of the cleaning time is practically difficult to be obtained. The cleaning method according to the embodiment reduces if not prevents such possible consequences by controlling the amount of the cleaning solution L to be unchanged in the cleaning operations.

FIGS. 4A to 4E and FIGS. 5A to 5E are explanatory drawings of the cleaning method according to the embodiment. FIG. 6 is a flowchart of the cleaning operations executed by the control unit 10.

Figure 4A:
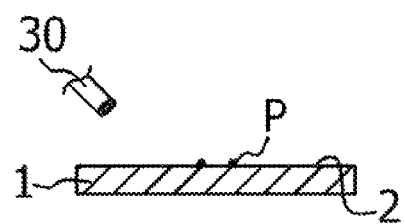
FIGS. 4A to 4E are explanatory drawings of the cleaning method according to another embodiment of the invention.
Figure 4B:
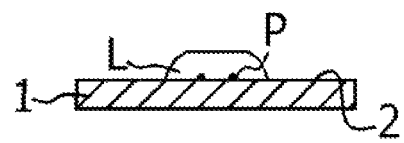

The control unit 10 causes the object 1 previously placed on the stage 6s to move to the desirable position for the cleaning operations. As illustrated in FIG. 4A, the control unit 10 causes the supply nozzle 30 to move toward a portion of the object 1, which is desired to be cleaned (Operation S1). As illustrated in FIG. 4B, the control unit 10 drives the pump 23 and causes the supply nozzle 30 to supply the cleaning solution L to the surface 2 (Operation S2). The amount of the cleaning solution L is 8 µL, for example. The control unit 10 causes the supply nozzle 30 to retract from the object 1.

Figure 4C:
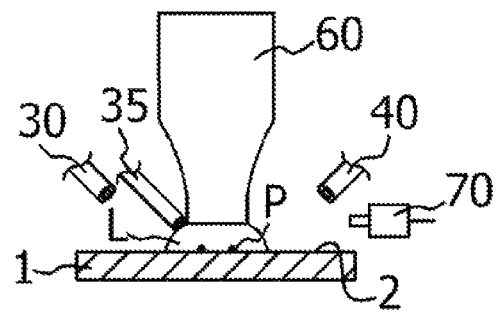
Figure 7A:
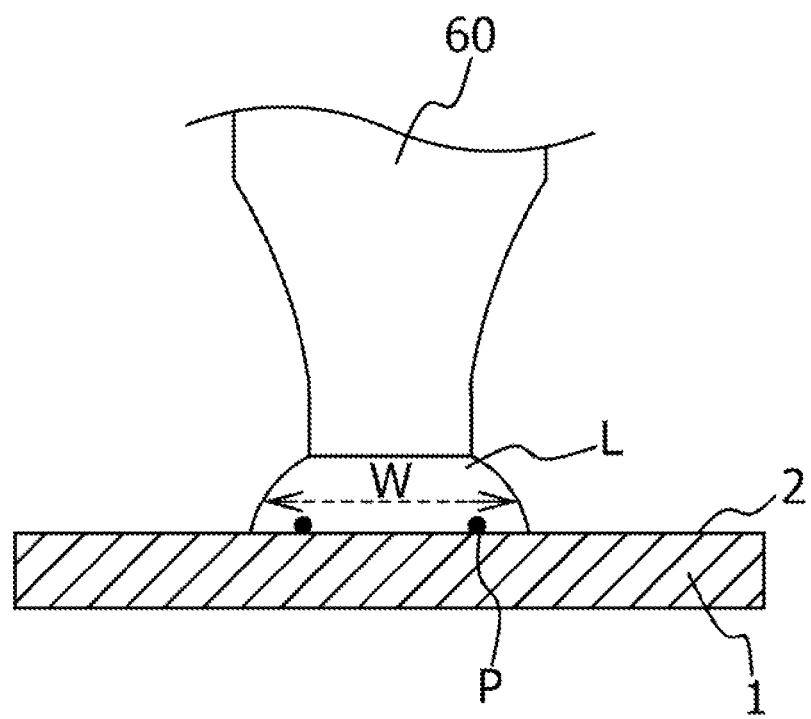
FIGS. 7A and 7B are explanatory drawings of a change in the shape of a cleaning solution.

The control unit 10 causes the horn 60 to move toward the object 1 (Operation S3) and to be coupled to the cleaning solution L as illustrated in FIG. 4C. The control unit 10 causes the camera 70 to capture the image of the cleaning solution L (Operation S4) before the cleaning solution L is subjected to the ultrasonic waves. A distance between the surface 2 and the horn 60 is about 3 mm, for example. FIG. 7A illustrates a state of the cleaning solution L that is not yet been subjected to the ultrasonic waves. The control unit 10 determines whether or not a width W in a middle portion of the cleaning solution L is within a certain range of values by measuring the width W according to the image captured by the camera 70 (Operation S5). The certain range is from 2.0 mm to 3.0 mm, for example. The width W of the cleaning solution L is parallel with the surface 2 of the object 1 when viewed from a side as illustrated in FIG. 7A.

When the width W is outside the certain range of values, the control unit 10 sends a warning to an operator (Operation S6). For example, the control unit 10 may turn on a warning light or to indicate warning information on a display or the like. When it is warned that the width W is beyond the certain range of values, the cleaning solution L on the surface 2 may be recovered by the recovery nozzle 40, and the cleaning operations may be performed again, for example. When the width W is less than the certain range, a minute amount of the cleaning solution L may be added to the cleaning solution L using the adding nozzle 35, for example, so that the width W may be within the certain range of values.

When the width W is within the certain range of values, the control unit 10 causes the horn 60 to apply the ultrasonic waves to the cleaning solution L (Operation S7).

Figure 4D:
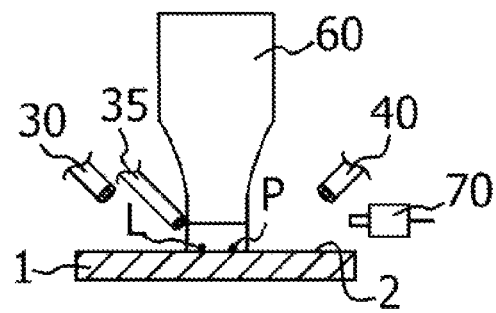

The application and then the cessation of the application of the ultrasonic waves is repeated every one second, for example. The cleaning solution L is agitated by the cavitation induced therein via the ultrasonic waves, and consequently the fine particles P start to move away from the surface 2 and float in the cleaning solution L as illustrated in FIG. 4D. The ultrasonic waves are applied to the cleaning solution L at a frequency of 200 kHz with an output of 0.2 w, for example.

When the cleaning solution L is subjected to the ultrasonic waves as described above, the atomization of the cleaning solution L near the surface 2 and the increased temperature of the cleaning solution L occur. Some of the cleaning solution L is evaporated because of the atomization and the increased temperature. Thus, a minute amount of the cleaning solution L is reduced by applying the ultrasonic waves.

The control unit 10 determines whether or not the application with the ultrasonic waves has been performed for a certain number of times (Operation S8), or has been performed for a desired duration, etc. When the application with the ultrasonic waves has not yet been performed for the certain number of times, the control unit 10 causes the camera 70 to capture the image of the cleaning solution L while the application with the ultrasonic waves stops as illustrated in FIG. 4D (Operation S9).

The control unit 10 measures a width Wn based on the captured image and determines whether or not a value that is obtained by subtracting the width Wn, which has been subjected to the ultrasonic waves, from the width W, which is not yet subjected to the ultrasonic waves, is within a range of set values (Operation S10). The value that is obtained by subtracting the width Wn from the width W indicates a reduced amount of the width of the cleaning solution L. When the value that is obtained by subtracting the width Wn from the width W is less than the range of set values, the control unit 10 performs Operation S7 and the operations after Operation 7 again. The set value may be 0.2 mm, for example. The width Wn indicates a width of the cleaning solution L obtained after application with the ultrasonic waves n times. The camera 70 captures the image of the cleaning solution L each time the application with the ultrasonic waves is stopped, thus the control unit 10 detects the reduction in the cleaning solution L based on the captured image of the cleaning solution L.

The camera 70 captures the image of the cleaning solution L before and after the cleaning solution L is subjected to the ultrasonic waves, as illustrated in FIG. 6 (Operation S4 and Operation S9), so that whether or not the amount of the cleaning solution L is reduced may be monitored before and after the cleaning solution L is subjected to the ultrasonic waves.

Figure 7B:
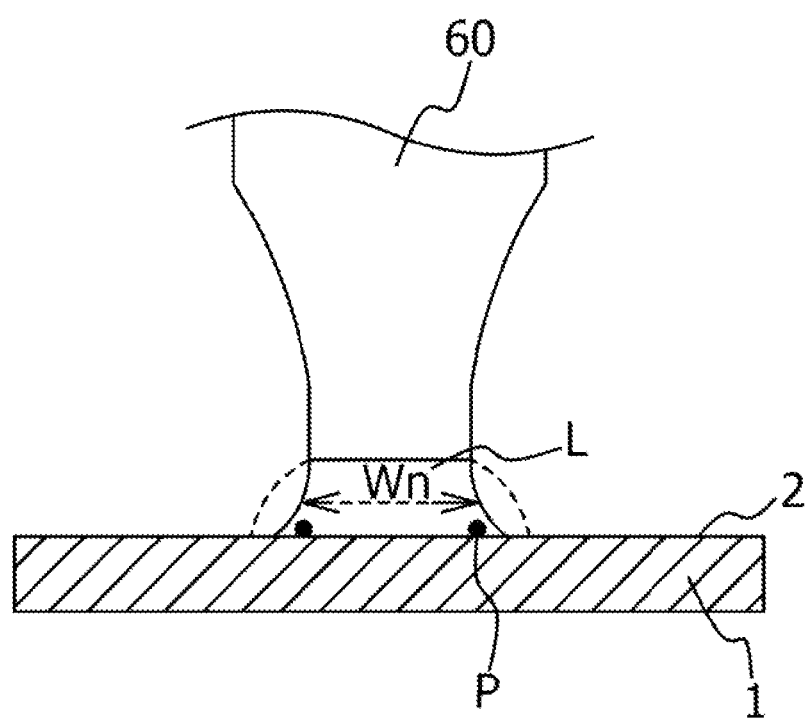

FIG. 7B illustrates the cleaning solution L that has been subjected to the ultrasonic waves. As illustrated in FIG. 7A and FIG. 7B, the amount of the cleaning solution L is reduced after the ultrasonic waves are applied. Widths, which are parallel with the surface 2, between a top and a bottom of the cleaning solution L vary because of the reduction in the cleaning solution L. The width in a portion where the cleaning solution L is coupled to the horn 60 or the surface 2 remains substantially unchanged, due to surface tension of the cleaning solution L. In the cleaning solution L, a shape between the portion that is coupled to the horn 60 and the portion that is in contact with the surface 2 changes easily. In FIG. 7A, the cleaning solution L has a protruding, e.g., convex, shape when viewed from a side. On the other hand, in FIG. 7B, the cleaning solution L has a recessed, e.g., concave, shape when viewed from a side. Thus, the reason for measuring the width of the cleaning solution L in a parallel direction with the surface 2 of the object 1 is that the width of the cleaning solution L may reflect the amount of the cleaning solution L.

When the cleaning operation starts with 8 μL of the cleaning solution L, for example, a width, which is parallel with the surface 2, in a middle portion of the cleaning solution L is about 2.2 mm to 2.5 mm. When the cleaning solution L is reduced by about 1 μL, the width is reduced by about 0.2 mm. In this case, as a compensation, the cleaning solution L may be supplied by about 1 μL as described later.

Figure 4E:
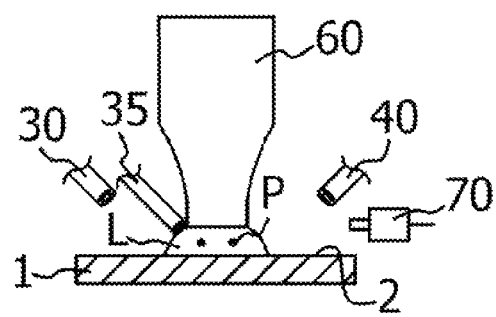

When a value that is obtained by subtracting the width Wn from the width W (namely, the difference) is beyond the certain range of values (or, in other words, exceeds a threshold difference), the control unit 10 causes the adding nozzle 35 to add a new cleaning solution L to the cleaning solution L supplied to the object 1 as illustrated in FIG. 4E (Operation S11). For example, 1 μL of the new cleaning solution L may be added so that the resultant cleaning solution L is approximately same amount as the amount of the cleaning solution L that is not yet subjected to the ultrasonic waves. The amount of the resultant cleaning solution L may be increased by a minute amount as compared to the amount of the cleaning solution L that is not yet subjected to the ultrasonic waves. Therefore, the occurrence of there becoming an undesirably-exposed part on the surface 2 where the cleaning solution L is no longer present upon the object 1 due to evaporation of some of the cleaning solution L may be reduced if not prevented. After that, the control unit 10 performs Operation S7 and the operations after Operation 7 again.

Thus, the amount of the cleaning solution L may be maintained approximately constant in the cleaning operations to reduce if not prevent there becoming an undesirably-exposed part on the surface 2 where the cleaning solution L is no longer present due to evaporation of some of the cleaning solution L. Hence, the occurrence of fine particles P remaining on the undesirably-exposed portion may be reduced if not prevented. In addition, the amount of the cleaning solution L may be maintained approximately constant in the cleaning operations. Thus the cleaning performance may be enhanced depending on the length of time for the cleaning operations.

Figure 5A:
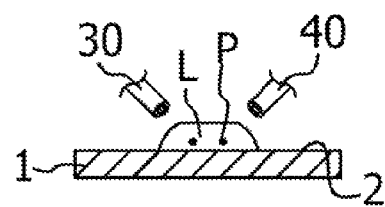
FIGS. 5A to 5E are explanatory drawings of the cleaning method according to the embodiment.
Figure 5B:
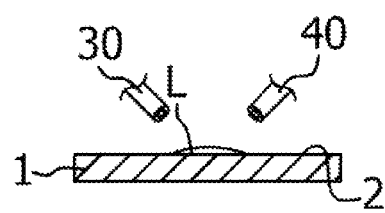

When the application with the ultrasonic waves is performed for the certain number of times (Yes in Operation S8), the control unit 10 causes the horn 60 to retract from the object 1 (Operation S12) as illustrated in FIG. 5A, and drives the reduced pressure pump 24 to recover the cleaning solution L by drawing the cleaning solution L through the recovery nozzle 40 as illustrated in FIG. 5B (Operation S13). As a result, the fine particles P floating in the cleaning solution L may be removed together with the cleaning solution L. In this case, a small amount of the cleaning solution L is left on the surface 2 so that it may be reduced if not prevented that the portion where the cleaning solution L dries is caused on the surface 2.

The amount of the left cleaning solution L is, e.g., around 30% of the original amount. In order to leave a specific amount of the cleaning solution L, the recovery nozzle 40 keeps away from the surface 2 by, e.g., more than about 1 mm. As a result, the cleaning solution L is left on the surface 2 because of the surface tension effect.

Figure 5C:
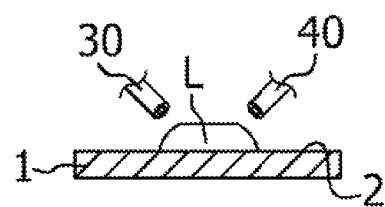
Figure 5D:
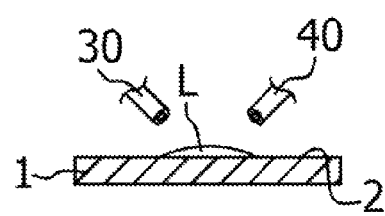

The control unit performs the rinsing operation. Rinsing solution L1 is supplied to the left cleaning solution L from the supply nozzle 30 as illustrated in FIG. 5C. An amount of the supplied rinsing solution L1 is greater than the amount of the left cleaning solution L. The amount of the supplied rinsing solution L1 may be 6 μL, for example. The rinsing solution L1 is drawn by the recovery nozzle 40 as illustrated in FIG. 5D. The amount of the recovered rinsing solution L1 may be 6 μcc, for example. As a result, the amount of the rinsing solution L1 left on the surface 2 may be, e.g., around 30% of the original amount.

Figure 5E:
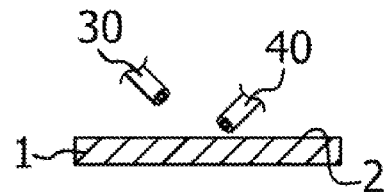

The rinsing solution L1 is removed substantially completely when dried at the end of the cleaning operation. After recovering the rinsing solution L1 by the recovery nozzle 40, the control unit 10 causes the recovery nozzle 40 to approach near the surface 2, e.g., at about 0.2 mm and draw the left rinsing solution L1 as illustrated in FIG. 5E. The air-drawing at the position may overcome the surface tension between the rinsing solution L1 and the surface 2. As a result, the rinsing solution L1 may be recovered substantially completely. After that, the control unit 10 causes the supply nozzle 30, the adding nozzle 35, the horn 60, and the like to retract from the surface 2, and the cleaning of the object 1 is completed.

The cleaning is performed as described above. The cleaning apparatus according to the embodiment detects the reduction in the amount of the cleaning solution L by capturing the image of the cleaning solution L. Alternatively, the reduction in the cleaning solution L may be detected by measuring a weight of the cleaning solution L. However, since the cleaning solution L is a minute amount even before the cleaning starts, accurate measurement equipment is desired to detect a change in the amount of the cleaning solution L. Such a minute amount of the change in the cleaning solution L may be detected by determining the reduction in the cleaning solution L based on a change in the shape of the cleaning solution L as described in the embodiment.

The minute amount of the cleaning solution L to be supplied may be changed depending on the value that is obtained by subtracting the width Wn from the width W in Operation S11 described above. As the value that is obtained by subtracting the width Wn from the width W is larger, the minute amount of the cleaning solution L to be supplied may be increased, for example. Therefore, the amount of the cleaning solution L supplied with the minute amount of the cleaning solution L may be controlled to be substantially the same as the amount of the cleaning solution L that is not yet subjected to the ultrasonic waves regardless of the reduced amount of the cleaning solution L.

The camera 70 may move around an axis of the horn 60 to capture images of the cleaning solution L from different angles more than once.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the inventions have been described in detail, it should be understood that the various changes, substitutions, and alterations could be made hereto without departing from the spirit and scope of the invention.

The invention claimed is:

1. A cleaning apparatus comprising:
   a supply unit configured to supply at least an initial amount of cleaning solution to a specific portion of an object to be cleaned;
   an agitator configured to induce agitation in the cleaning solution supplied to the object;
   a monitoring unit including a camera to capture an image of a shape of the cleaning solution existing between the specific portion of the object and the agitator and configured to monitor an amount of the cleaning solution and to provide a signal indicative thereof and convert the image of the shape into the signal; and
   a control unit configured to detect a threshold amount of reduction in the cleaning solution based on the signal from the monitoring unit and accordingly to control the supply unit to supply an additional amount of cleaning solution to the specific portion of the object.

2. The cleaning apparatus according to claim 1, wherein the control unit is further operable to detect the reduction in the cleaning solution based on a width of the cleaning solution, the width being parallel with a surface of the object supplied with the cleaning solution.

3. The cleaning apparatus according to claim 1, wherein the monitoring unit is further operable to monitor the amount of the cleaning solution before and after oscillation is applied to the cleaning solution.

4. The cleaning apparatus according to claim 1, wherein the control unit is further operable to control the supply unit to supply the additional amount of cleaning solution before a part of the object that otherwise would be covered with the cleaning solution becomes exposed due to the reduction in the cleaning solution.

5. The cleaning apparatus according to claim 1, wherein the additional amount of the new cleaning solution that the control unit controls the supplying unit to supply is equal to or greater than the reduced amount of the cleaning solution.

6. The cleaning apparatus according to claim 1, wherein the agitator applies ultrasonic waves to the object.

\* \* \* \* \*